US006740824B2

United States Patent
Poglitsch et al.

(10) Patent No.: US 6,740,824 B2
(45) Date of Patent: May 25, 2004

(54) GROUND CONNECTOR ASSEMBLY WITH SUBSTRATE STRAIN RELIEF AND METHOD OF MAKING SAME

(75) Inventors: Lawrence R. Poglitsch, Barrington, IL (US); Ronald Li, Kildeer, IL (US); Alan S. Kang, Buffalo Grove, IL (US); Todd Ringa, Lake in the Hills, IL (US); Steven G. Sharkey, Island Lake, IL (US); Rick Cihak, Fox River Grove, IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/179,066

(22) Filed: Jun. 25, 2002

(65) Prior Publication Data

US 2003/0234117 A1 Dec. 25, 2003

(51) Int. Cl.$^7$ .......................... H05K 1/11; H01R 12/04
(52) U.S. Cl. ...................... 174/261; 174/254; 174/262; 174/263; 361/749
(58) Field of Search ................... 174/261, 254, 174/256, 258, 262, 263, 264, 135, 72 A; 361/749, 746, 750, 753; 439/67, 108; 324/761, 762, 763; 257/691, 698

(56) References Cited

U.S. PATENT DOCUMENTS

| | | | |
|---|---|---|---|
| 3,264,524 A | 8/1966 | Dahlgren et al. | |
| 3,484,937 A | 12/1969 | Campbell, Jr. et al. | |
| 3,489,879 A | 1/1970 | Salzer | |
| 3,494,029 A | 2/1970 | Theilgaard | |
| 4,121,044 A * | 10/1978 | Hadersbeck et al. | 174/254 |
| 4,435,740 A * | 3/1984 | Huckabee et al. | 361/749 |
| 5,189,261 A | 2/1993 | Alexander et al. | |
| 5,305,523 A | 4/1994 | Bross et al. | |
| 5,435,723 A * | 7/1995 | Angulas et al. | 439/67 |
| 5,631,446 A * | 5/1997 | Quan | 174/254 |
| 5,644,474 A * | 7/1997 | Jang | 361/753 |
| 5,856,656 A * | 1/1999 | Kim | 219/702 |
| 5,917,149 A | 6/1999 | Barcley et al. | |
| 5,924,873 A | 7/1999 | Barcley et al. | |
| 6,120,325 A * | 9/2000 | Abe | 439/607 |
| 6,150,614 A * | 11/2000 | Miller et al. | 174/254 |
| 6,223,431 B1 | 5/2001 | Doikas et al. | |
| 6,326,554 B1 | 12/2001 | Gillette et al. | |
| 6,420,017 B1 * | 7/2002 | Matsuda et al. | 428/209 |
| 6,425,691 B1 * | 7/2002 | Demangone | 385/53 |

FOREIGN PATENT DOCUMENTS

WO    WO 99/62143    12/1999

\* cited by examiner

*Primary Examiner*—David A. Zarneke
*Assistant Examiner*—I B Patel
(74) *Attorney, Agent, or Firm*—Thomas V. Miller; Brian M. Mancini

(57) ABSTRACT

A ground connector assembly (20) having a substrate (22) and a ground member (24). The substrate (22) is used to retain an electrical circuit and has a ground region (34), a ground hole (30), and at least one strain relief slot (32). The ground member (24) is attached within the ground hole (30). The ground region (34) surrounds the ground hole (30) and is at least partially interposed between the ground hole (30) and the strain relief slot (32). The ground connector assembly (20) may further include a conductive ring (42), such as a copper ring, surrounding the ground hole (30) and attached to the ground region (34). There is also a method of making the ground connector assembly (20).

13 Claims, 2 Drawing Sheets of the invention as defined by the appended claims.

GROUND CONNECTOR ASSEMBLY WITH SUBSTRATE STRAIN RELIEF AND METHOD OF MAKING SAME

FIELD OF THE INVENTION

The invention in general relates to ground connector assemblies for substrates and, more particularly, to a method and apparatus for securing a ground member having substrate strain relief.

BACKGROUND OF THE INVENTION

Electrical circuits on thin, flexible substrates are used in a variety of applications including automotive control modules. Thin substrates are typically fabricated from a nylon material, such as a polyimide. There is an increasing interest in using less expensive materials for the substrate. Thin FR4 sheets are less expensive than polyimide sheets; however, FR4 is more rigid than polyimide. As explained in more detail below, the use of a more rigid material may cause failures from strain by the substrate due to thermal changes.

Electrical circuits need to be grounded for electrical functionality and electrical magnetic interface (EMI) reasons. Existing ground connectors on thin substrates use a solder connection between the circuit and a metallic ground plate. As explained above, FR4 is more rigid than polyimide. However, it has been found that failure of the ground connector may occur due to strain and flex of the substrate at varying operating temperatures. This is especially prevalent in automotive environments where temperatures may drastically change. In particular, during typical operating thermal cycles, the increased strain by some substrates may cause the ground connector to actually separate from a metallic ground plate—leaving the electrical circuit at fault due to an open ground connection.

Accordingly, there is a need for reducing the strain causing by thermal changes of a thin substrate. Reducing strain allows the use of less expensive, but more rigid, substrates. This is especially important in high volume applications such as electronic control modules for vehicles. It is, therefore, desirable to provide an improved assembly and method for securing a ground connector to overcome most, if not all, of the preceding problems.

Figure 1:
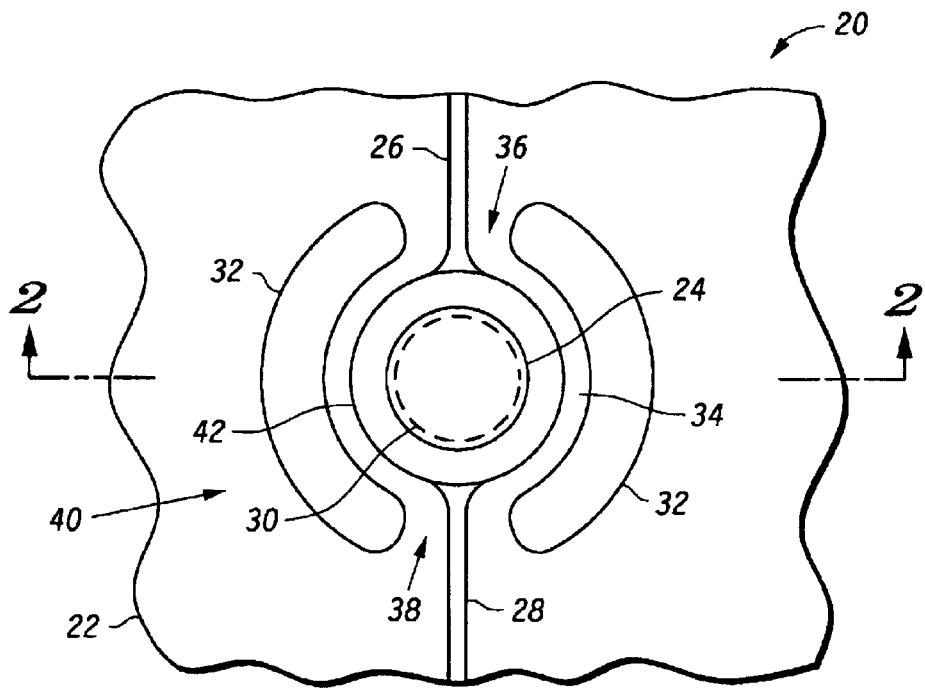
FIG. 1 is a top view of a ground connector assembly of the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a ground connector assembly and method for securing a ground member in a substrate to reduce strain on the substrate due to thermal induced changes. For purposes of illustration, an example of an assembly and method will be described in the context of a ground member in an electronic control module for a vehicle. However, the present invention is not limited to ground members in modules for vehicles but may also apply to other devices and substrates where strain relief is needed.

To this end, generally, in one embodiment there is a ground connector assembly having a substrate and a ground member. The substrate is used to retain an electrical circuit and has a ground region, a ground hole, and at least one strain relief slot. The ground member is attached within the ground hole. The ground region surrounds the ground hole and is at least partially interposed between the ground hole and the strain relief slot. The ground connector assembly may further include a conductive ring, such as a copper ring, surrounding the ground hole and attached to the ground region.

In another embodiment, there is a ground connector assembly having a ground plate, a substrate, and a ground member. The ground plate has a solderable, electrically conductive region. The substrate retains an electrical circuit and has a ground region, a ground hole, and at least one strain relief slot. The ground member is attached within the ground hole of the substrate and to the solderable, electrically conductive region of the ground plate. The ground region surrounds the ground hole and is at least partially interposed between the ground hole and the at least one strain relief slot.

Additionally, there is a method for securing a ground member to a substrate. The method includes the steps of: providing a ground plate; forming a solderable, electrically conductive region on the ground plate; providing a substrate, the substrate having an electrical circuit; forming a ground hole and at least one strain relief slot in the substrate; attaching the substrate to the ground plate such that the ground hole is adjacent to the solderable, electrically conductive region; and forming a ground member within the ground hole such that the ground member is attached to the ground hole and the solderable, electrically conductive region. The method may further include the step of forming a conductive ring around the ground hole such that the conductive ring is at least partially interposed between the ground hole and the strain relief slot.

Now, turning to the drawings, an example ground connector assembly of the present invention will be explained. FIG. 1 shows a ground connector assembly 20. In one embodiment, generally, the ground connector assembly 20 may have a substrate 22 and a ground member 24. The substrate 22 is used for mounting or retaining an electrical circuit (not shown). The exact components and circuitry are implementation specific but may include devices such as transistors, processors, and memory. Between the various devices of the circuitry may be conductive traces. FIG. 1 shows two conductive traces 26, 28 that are electrically connected to the ground member 24.

The electrical circuit on the substrate 22 needs to be grounded. In one embodiment of the present invention, the substrate 22 has a ground hole 30 and strain relief slots 32. The substrate 22 further has a ground region 34 that surrounds the ground hole 30 and is at least partially interposed between the ground hole 30 and strain relief slots 32.

Figure 3:
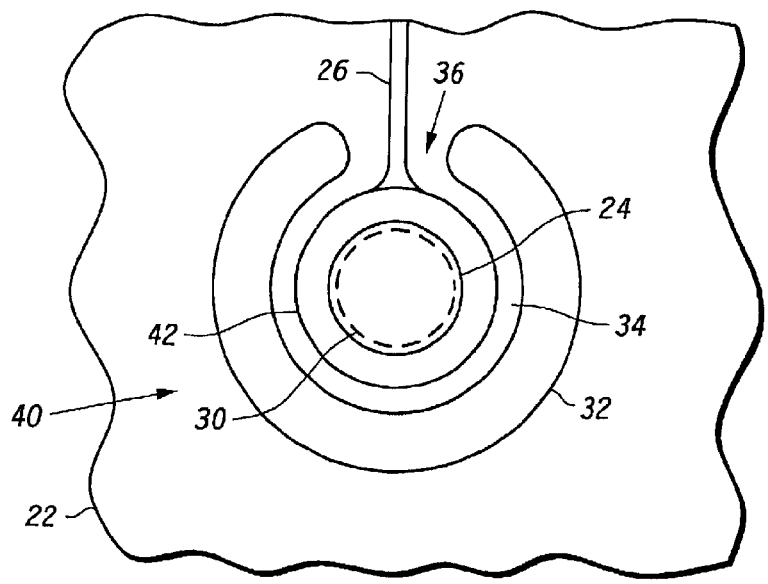
FIG. 3 is a top view of another embodiment of a ground connector assembly of the present invention.

The substrate 22 may further have bridge regions 36, 38 that join the ground region 34 of the substrate 22 to an outer, non-ground region 40 of the substrate 22. The outer, non-ground region 40 is where the remainder of the electrical circuitry on the substrate 22 would reside. The bridge regions 36, 38 may be used for holding the conductive traces 26, 28 that connect the electrical circuit to the ground member 24. One of ordinary skill in the art will realize that the number and size of the bridge regions 36, 38 and strain relief slots 32 are implementation specific. FIG. 1 shows two bridge regions and two strain relief slots. If the circuit requires only one conductive trace to the ground member 24, then there may be only one bridge region and one strain relief slot as shown in FIG. 3.

In connecting the conductive traces 26, 28 to the ground member 24, it is preferred that the ground connector assembly further includes an electrically conductive ring 42. The conductive ring 42 may be deposited or electrically plated on the substrate 22 at the same time the conductive traces 26, 28 are placed on the substrate 22. This conductive ring 42 may be made of various electrically conductive materials. One suitable material is copper. In one embodiment, the conductive ring 42 surrounds the ground hole 26 and is at least partially interposed between the ground hole 30 and strain relief slots 32.

The ground member 24 is made of an electrically conductive material and is positioned within the ground hole 30. In one embodiment, the ground member 24 is formed from a solder paste deposited within the ground hole 30. The ground member 24 may be formed and attached to the ground hole 30 by solder bonding the solder paste. This may be accomplished by reflowing the solder paste in a reflow oven.

Figure 2:
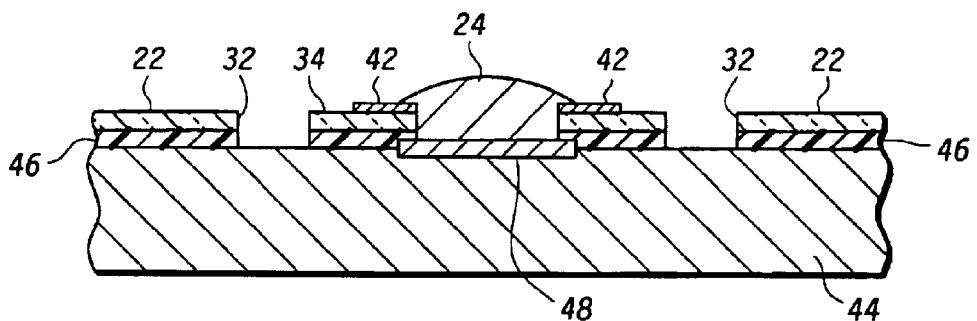
FIG. 2 is a cross sectional view of the ground connector assembly in FIG. 1 across section 2—2.

Referring to FIG. 2, the substrate 22 and ground member 24 may be attached to a ground plate 44. The ground plate 44 is made of a metallic material such as aluminum. The ground plate 44 may be a separate component or may be the outer packaging or housing of a control module that houses the electric circuit on the substrate 22. In one embodiment, the substrate 22 is attached to the ground plate 44 by a pressure sensitive adhesive 46. Many types of pressure sensitive adhesives are publicly available and known to those of ordinary skill in the art.

The ground member 24 is also connected to the ground plate 44. However, the connection needs to be an electrically conductive connection. In one embodiment, where the ground member 24 is formed from a solder paste, the solder paste is bonded to the ground plate 44 by reflowing the solder paste in a reflow oven. If the ground plate 44 is made of a material that does not provide good solderability (such as aluminum), then a solderable region needs to be added to the ground plate 44. As shown in FIG. 2, this may be done by adding a solderable, electrically conductive region 48. The solderable, electrically conductive region 48 may be formed on the ground plate 44 by welding a solderable metallic layer (such as copper) to a region on the ground plate 44.

As those of ordinary skill will appreciate, the method and device described herein reduces the strain caused by thermal changes of the substrate 22 by adding the strain relief slots 32 and ground region 34. As the substrate 22 is subjected to changing temperatures, the strain relief slots 32 will relieve any strain on the ground member 24—preventing the ground member 24 from separating from the ground plate 44. In other words, the use of the strain relief slots 32 reduces the stiffness of the substrate 22 local to the ground region 34.

Figure 4:
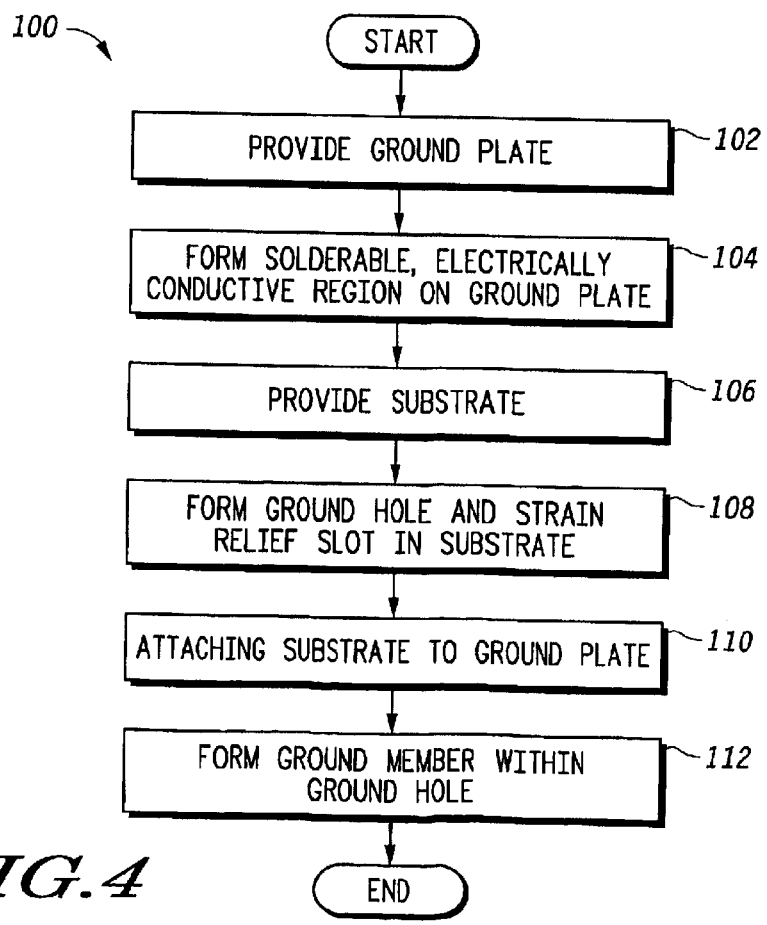
FIG. 4 is a logic flow diagram of a process for securing a ground member in the assembly of FIG. 1 in accordance with an embodiment of the present invention.

FIG. 4 is a logic flow diagram of a process 100 of securing a ground member 24 to a substrate 22 in accordance with an embodiment of the present invention. The process starts at block 102 by providing a metallic ground plate 44. The ground plate 44 may be the outer packaging or housing of a control module that houses the electrical circuitry of a device. Alternatively, the ground plate 44 may be a separate component of the module. The process proceeds to block 104 where a solderable, electrically conductive region 48 is formed on the ground plate 44. This is needed when the ground plate 44 is made of a metallic material that is not practically solderable. As explained above, the solderable, electrically conductive region 48 may be formed by welding a solderable metallic layer (such as copper) to a region on the ground plate 44.

The process proceeds to block 106 by providing a substrate 22 having an electrical circuit. The exact components and circuitry on the substrate 22 are implementation specific but may include devices such as transistors, processors, and memory. Between the various devices of the circuitry may be conductive traces. The conductive traces may be electrically plated or masked onto the substrate 22. The process proceeds to block 108 where a ground hole 30 and at least one strain relief slot 32 are formed in the substrate 22. This may be accomplished by milling the hole and slot in the substrate 22. Although not shown in the process in FIG. 3, the process may further include forming a conductive ring 42 around the ground hole 30 such that the conductive ring 42 is at least partially interposed between the ground hole 30 and the strain relief slot 32.

The process proceeds to block 110 where the substrate 22 is attached to the ground plate 44. The ground hole 30 in the substrate 22 should be positioned adjacent to or, in other words, above the solderable, electrically conductive region 48. The substrate 22 may be attached to the ground plate 44 by a pressure sensitive adhesive. An automated pick-and-place machine may accomplish the deposit of the adhesive and attachment of the substrate 22 to the ground plate 44.

The process further proceeds to block 112 where a ground member 24 is formed within the ground hole 30 of the substrate 22 such that the ground member 24 is attached to the ground hole 30 and the solderable, electrically conductive region 48. The ground member 24 may be formed by placing solder paste in the ground hole 30 by an automated pick-and-place machine. The ground member 24 is secured to the ground hole 30 and the solderable, electrically conductive region 48 by a solder bond, preferably by reflowing solder paste in a reflow oven.

The steps of the process 100 need not be performed in the exact order recited above. For example, the substrate 22 may be provided and processed before the ground plate 44 is provided and processed. The above steps may be done by a mechanical process or in connection with an automated pick-and-place machine.

What has been described is a ground connector assembly and method for securing a ground member in a substrate to reduce strain failures by the substrate due to thermal changes. The assembly and method described herein significantly reduces strain failures by adding a ground region surrounded, at least partially, by strain relief slots. Accordingly, more rigid, and less expensive, substrates may be used for the device. The use of less expensive substrates can be of particular interest in high volume production applications. The present invention also increases the life and reliability of the ground connection.

The above description of the present invention is intended to be exemplary only and is not intended to limit the scope of any patent issuing from this application. For example, the present discussion used a ground member for a ground plate of a module to illustrate the method and apparatus of the present invention. The present invention may apply to other applications where failures due to strain may occur. The present invention is intended to be limited only by the scope and spirit of the following claims.

What is claimed is:

1. A ground connector assembly comprising:
   a ground plate having a solderable, electrically conductive region;
   a flexible circuit board having a substrate, an electrical circuit, a ground region, a ground hole, and at least one strain relief slot;
   an adhesive, the adhesive attaching the flexible circuit board to the ground plate; and
   a ground member attached within the ground hole, the ground member connecting the ground region to the electrically conductive region;
   wherein the ground region surrounds the ground hole and is at least partially interposed between the ground hole and the at least one strain relief slot.

2. The ground connector assembly of claim 1 wherein the ground connector assembly further has a conductive ring surrounding the ground hole and attached to the ground region.

3. The ground connector assembly of claim 1 wherein the substrate is made of FR4 material.

4. The ground connector assembly of claim 1 wherein the ground member is made from a solder paste.

5. The ground connector assembly of claim 1 wherein the ground plate is non-solderable and has a solderable, electrically conductive region formed thereon for electrically connecting the ground member to the ground plate.

6. The ground connector assembly of claim 5 wherein the ground plate is made from aluminum.

7. The ground connector assembly of claim 2 wherein the conductive ring is made from copper.

8. The ground connector assembly of claim 1 wherein the substrate further has at least one bridge regions with an associated conductive trace thereon and at least one strain relief slot, the conductive trace on the at least one bridge region connecting the ground region to circuitry on an outer, non-ground region of the substrate.

9. A ground connector assembly comprising:
   a ground plate having a solderable, electrically conductive region;
   a flexible circuit board having an FR4 substrate, an electrical circuit, a ground region, a ground hole, and at least one strain relief slot, the ground hole adjacent to the solderable, electrically conductive region of the ground plate;
   a conductive ring surrounding the ground hole and attached to a top surface of the ground region of the substrate;
   an adhesive, the adhesive attaching the flexible circuit board to the ground plate; and
   a ground member attached within the ground hole of the substrate, to the conductive ring, and to the solderable, electrically conductive region of the ground plate;
   wherein the ground region surrounds the ground hole and is substantially interposed between the ground hole and the at least one strain relief slot.

10. The ground connector assembly of claim 9 wherein the substrate is FR4 material.

11. The ground connector assembly of claim 9 wherein the ground member is made from a solder paste.

12. The ground connector assembly of claim 9 wherein the ground plate is made from aluminum.

13. The ground connector assembly of claim 9 wherein the substrate further has two bridge regions with associated conductive traces disposed thereon and two strain relief slots, the two conductive trace on the associated bridge regions connecting the ground region to circuitry on an outer, non-ground region of the substrate.

* * * * *